(12) United States Patent
Hsu et al.

(10) Patent No.: US 7,303,971 B2
(45) Date of Patent: Dec. 4, 2007

(54) MSM BINARY SWITCH MEMORY DEVICE

(75) Inventors: Sheng Teng Hsu, Camas, WA (US); Tingkai Li, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 301 days.

(21) Appl. No.: 11/184,660

(22) Filed: Jul. 18, 2005

(65) Prior Publication Data
US 2007/0015328 A1    Jan. 18, 2007

(51) Int. Cl.
*H01L 21/20* (2006.01)

(52) U.S. Cl. .............. 438/381; 438/238; 257/E21.304; 257/E21.645; 257/E21.646; 257/E21.657; 257/E21.659

(58) Field of Classification Search ............... 438/381, 438/238, 692, 738
See application file for complete search history.

(56) References Cited

U.S. PATENT DOCUMENTS

| | | | |
|---|---|---|---|
| 5,496,759 A * | 3/1996 | Yue et al. ................. | 438/3 |
| 5,838,608 A * | 11/1998 | Zhu et al. ................. | 365/158 |
| 6,013,950 A * | 1/2000 | Nasby ....................... | 257/734 |
| 6,331,944 B1 * | 12/2001 | Monsma et al. ........... | 365/171 |
| 6,753,561 B1 | 6/2004 | Rinerson et al. .......... | 257/295 |
| 6,914,810 B2 * | 7/2005 | Hosotani .................. | 365/173 |
| 7,079,442 B2 * | 7/2006 | Rinerson et al. ......... | 365/230.06 |

* cited by examiner

*Primary Examiner*—David Nhu
(74) *Attorney, Agent, or Firm*—Law Office of Gerald Maliszewski; Gerald Maliszewski (57) ABSTRACT

A metal/semiconductor/metal (MSM) binary switch memory device and fabrication process are provided. The device includes a memory resistor bottom electrode, a memory resistor material over the memory resistor bottom electrode, and a memory resistor top electrode over the memory resistor material. An MSM bottom electrode overlies the memory resistor top electrode, a semiconductor layer overlies the MSM bottom electrode, and an MSM top electrode overlies the semiconductor layer. The MSM bottom electrode can be a material such as Pt, Ir, Au, Ag, TiN, or Ti. The MSM top electrode can be a material such as Pt, Ir, Au, TiN, Ti, or Al. The semiconductor layer can be amorphous Si, $ZnO_2$, or $InO_2$.

22 Claims, 8 Drawing Sheets

WORST CASE EQUIVALENT CIRCUIT

- $V_S$ = SELECTED WORD LINE VOLTAGE
- $V_W$ = UN-SELECTED WORD LINE VOLTAGE
- $V_O$ = OUTPUT VOLTAGE
- n = NUMBER OF BITS PER WORD
- $R_F$ = MSM FORWARD RESISTANCE
- $R_R$ = MSM REVERSE RESISTANCE
- $R_H$ = PCMO HIGH RESISTANCE STATE
- $R_L$ = PCMO LOW RESISTANCE STATE
- $R_O$ = LOAD RESISTANCE

Fig. 9

1: HIGH STATE
2,3: LOW STATE $V_S = 1$
$V_W = 0.25$
ALL UNSELECTED BIT $R_L$
n = # OF BIT LINES
R(LOAD) = $10 R_L$
NON MSM
LINE 1: $R_H = R_L$
LINE 2: $R_H = 4 R_L$
LINE 3: $R_H = 8 R_L$

MSM BINARY SWITCH MEMORY DEVICE

BACKGROUND OF THE INVENTION

1. Field of the Invention

This invention generally relates to integrated circuit (IC) memory fabrication and, more particularly, to a metal/semiconductor/metal (MSM) binary switch memory device.

2. Description of the Related Art

A cross point memory array is a matrix of memory elements, with electrical contacts arranged along x-axes (i.e., word lines) and along y-axes (i.e., bit lines). In some aspects, a digital value is stored as a memory resistance (high or low). The memory state of a memory cell can read by supplying a voltage to the word line connected to the selected memory element. The resistance or memory state can be read as an output voltage of the bit line connected to the selected memory cell.

Cross point resistor memory arrays are prone to read disturbance problems. As part of the read operation, electric current flows from a selected word line, through a selected memory cell, to a bit line. However, current also flows into unselected word lines that happen to cross over the selected bit line. The conduction of current into unselected word lines acts to decrease the output impedance and, hence, reduce the output voltage. To clearly distinguish memory states, the output voltage must be clearly distinguishable.

The undesired flow of current through a resistance memory cell can be addressed through the use of series-connected diodes, since reverse biased diodes are poor conductors. However, this same feature makes a one-diode/one resistor (1D1R) memory difficult to program. Programming voltages cannot be used that reverse bias the diode. Therefore, 1D1R cells are better for suited for unipolar programming. Further, diodes are preferable formed from single crystal silicon, for optimal performance. However, large crystal grains are difficult to form using thin-film deposition processes.

Many cross point resistor memory array structures have been proposed in attempts to minimize cross-talk problems during read operations in a large area cross point resistor memory array. IRID memory cell are well suited for a mono-polarity programming memory array. However, good diodes can only be fabricated on single crystal silicon. For multi-layer three-dimensional arrays, the upper layer of a diode is formed by re-crystallization of deposited silicon, and the resulting diode usually exhibits poor electrical properties. In addition, the diode must be formed from a silicon film that is fairly thick.

Rinerson et al, U.S. Pat. No. 6,753,561, have proposed a memory cell of a metal/insulator/metal (MIM) structure in series with a resistor memory. The MIM device is non-conductive at low biases. When the bias voltage is higher than a certain value, the conductivity drastically increases. This voltage is called either the "current rise-up voltage" or "varistor voltage". The high field generated in response to the MIM high current region is associated with impact ionization. As a result, the current voltage characteristics are reversible only at relatively low current conditions. The MIM device is unable to handle a large current density. In addition, Rinerson does not teach specific MIM materials, or how a MIM device is fabricated.

Current-sensing techniques have been used to better differentiate read memory signals in a large area array. However, current sensing requires a high-gain operational amplifier, which consumes relatively large areas of chip space.

It would be advantageous if the current flow through unselected lines in a cross point resistor memory cell array could be reduced, to maximize the bit line output voltage.

It would be advantageous if current flow through unselected lines could be reduced without the use of reverse biased diodes.

SUMMARY OF THE INVENTION

The present invention describes a memory cell with a unique structure. A metal/semiconductor/metal (MSM) binary switch is formed, which is a series combination of an MSM device and a memory resistor. Unlike a conventional diode, which has a high conductivity when forward biased, and poor conductivity when reverse biased, the MSM binary switch displays a binary resistance characteristic. When forward biased, the MSM binary switch has a substantially constant current (low resistance), regardless of voltage. Likewise, when the device is reverse biased, the current remains substantially constant (high resistance) and independent of the voltage amplitude. The high resistance under reverse bias conditions minimizes the bit line current flows into unselected word lines. Hence, the quality of the bit output signal is maximized.

Accordingly, an MSM binary switch memory device is provided. The device comprises a memory resistor bottom electrode, a memory resistor material over the memory resistor bottom electrode, and a memory resistor top electrode over the memory resistor material. An MSM bottom electrode overlies the memory resistor top electrode, a semiconductor layer overlies the MSM bottom electrode, and an MSM top electrode overlies the semiconductor layer.

The MSM bottom electrode can be a material such as Pt, Ir, Au, Ag, TiN, or Ti. The MSM top electrode can be a material such as Pt, Ir, Au, TiN, Ti, or Al. The semiconductor layer can be amorphous Si, $ZnO_2$, or $InO_2$.

An MSM binary switch crosspoint memory array is also provided. The array comprises a first plurality of bit lines, a second plurality of MSM binary switch memory devices overlying each bit line, and a third plurality of word lines. Each word line is connected to each bit line through a unique intervening MSM binary switch memory device. The MSM binary switch memory device is as described above.

Additional details of the above-described memory device and memory array, as well as associated fabrication processes, are provided below.

DETAILED DESCRIPTION

Figure 1:
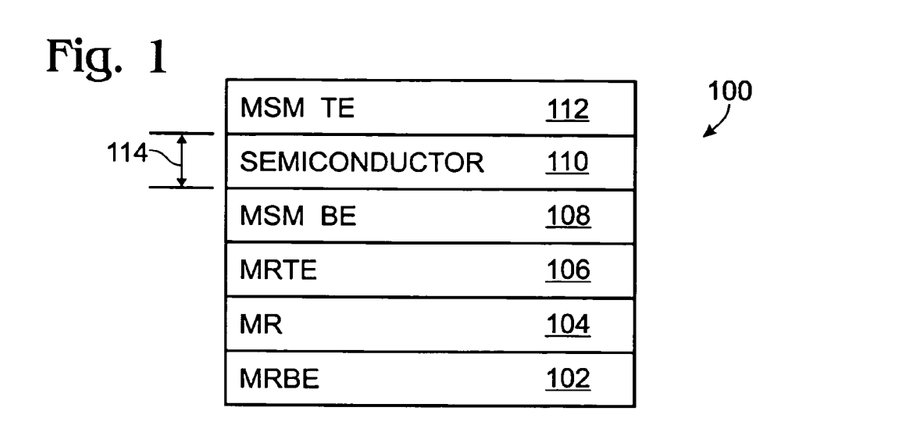
FIG. 1 is a partial cross-sectional view of a metal/semiconductor/metal (MSM) binary switch memory device.

FIG. 1 is a partial cross-sectional view of a metal/semiconductor/metal (MSM) binary switch memory device. The device 100 comprises a memory resistor (MR) bottom electrode (BE) 102, and a memory resistor material 104 overlying the memory resistor bottom electrode 102. Materials such as Pt, Ir, TiN, and Au are suitable as the bottom electrode 102. Some materials that can be used as the memory resistor bottom electrode are $Pr_{0.3}Ca_{0.7}MnO_3$ (PCMO), colossal magnetoresistive (CMR) film, transition metal oxides, Mott insulators, high-temperature super conductor (HTSC), and perovskite materials.

A memory resistor top electrode (TE) 106 overlies the memory resistor material 104. Materials such as Ag, Au, Pt, Ir, or TiN may be used as the top electrode 106. An MSM bottom electrode 108 overlies the memory resistor top electrode 106. The MSM bottom electrode 108 can be made from a material such as Pt, Ir, Au, Ag, TiN, or Ti. A semiconductor layer 110 overlies the MSM bottom electrode 108. The semiconductor layer 110 can be a material such as amorphous Si, $ZnO_2$, or $InO_2$. An MSM top electrode 112 overlies the semiconductor layer 110. The MSM top electrode can be Pt, Ir, Au, TiN, Ti, or Al. Typically, the semiconductor layer 110 has a thickness 114 in the range of 20 to 1000 nanometers.

Figure 2:
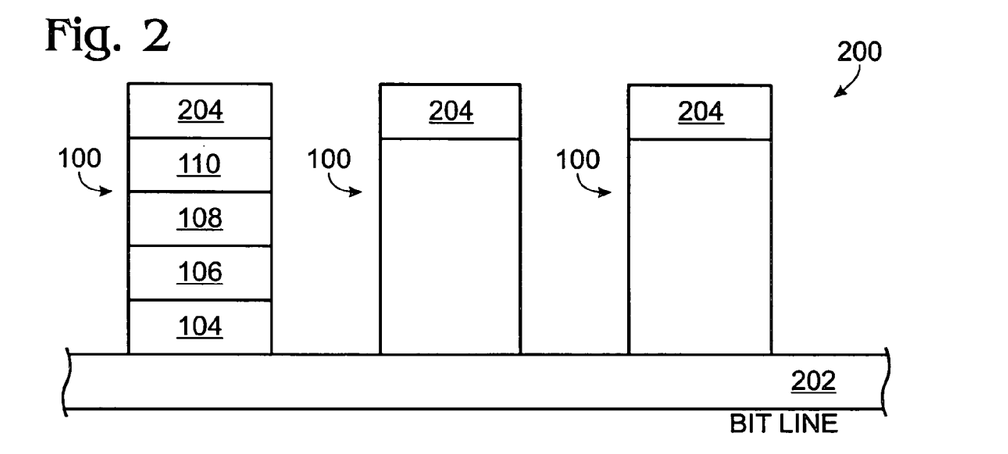
FIG. 2 is a partial cross-sectional view of an MSM binary switch crosspoint memory array.

FIG. 2 is a partial cross-sectional view of an MSM binary switch crosspoint memory array. The array 200 comprises a first plurality of bit lines 202 parallely aligned in a first direction (along the surface of the page). Although only a single bit lines is shown, the array is not limited to any particular number. A second plurality of MSM binary switch memory devices 100 overlies each bit line 202. A third plurality of word lines 204 is parallely aligned in a second direction, orthogonal to the first direction (into the page). Although only three word lines are shown, the array is not limited to any particular number. Each word line 204 is connected to each bit line 202 through a unique intervening MSM binary switch memory device 100.

FIG. 2 describes a conventional array arrangement. The novelty of the array is in the use of an MSM binary switch memory device 100. As shown in FIG. 1, each MSM binary switch memory device 100 includes a memory resistor material 104 overlying the bit line 202, a memory resistor top electrode 106 overlies the memory resistor material 104. An MSM bottom electrode 108 overlies the memory resistor top electrode 106, a semiconductor layer 110 overlies the MSM bottom electrode 108, and an MSM top electrode overlies the semiconductor layer 110 at the intersection of the memory device 100 with the word line 204.

Functional Description

Figure 3:
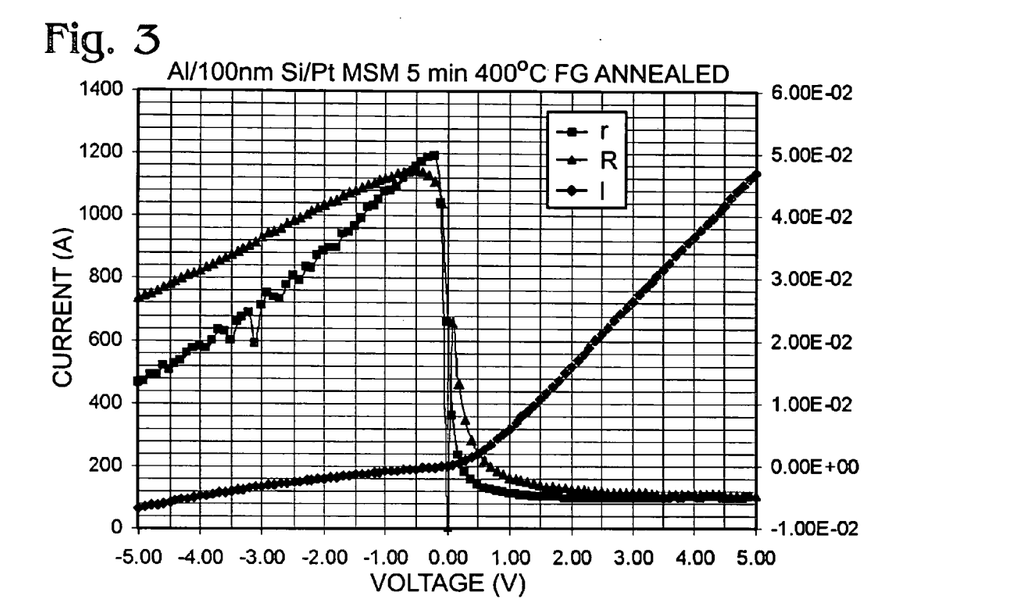
FIGS. 3 and 4 are current vs. voltage (I-V) graphs of MSM binary switch resistor memory cells, using different thicknesses of semiconductor material.
Figure 4:
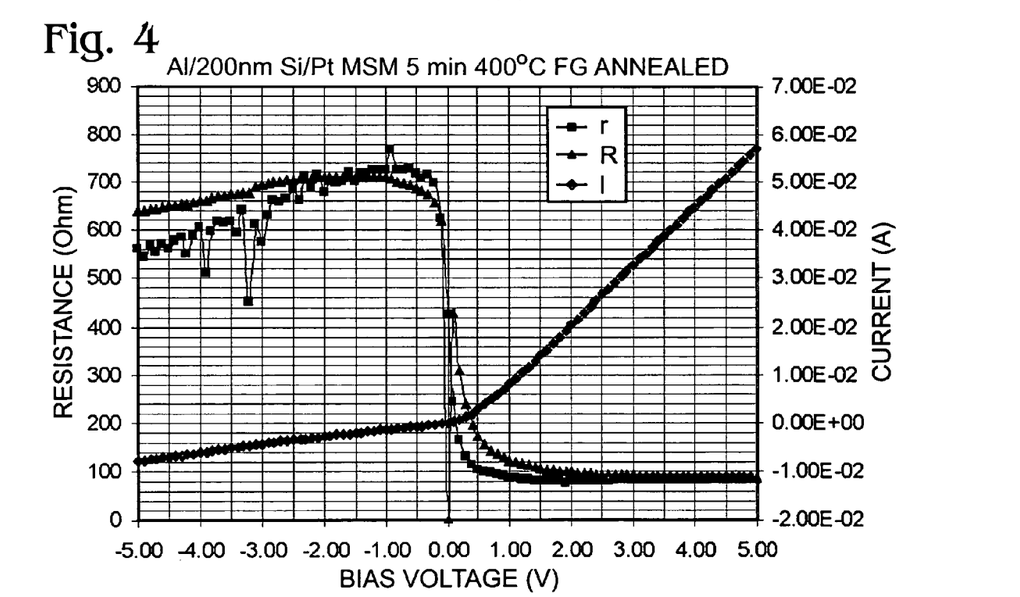

FIGS. 3 and 4 are current vs. voltage (I-V) graphs of MSM binary switch resistor memory cells, using different thicknesses of semiconductor material. The MSM binary switch resistor memory cell has been fabricated and characterized using a Pt/a:Si/Al MSM structure. FIG. 3 shows resistance, current, and voltage for a 100 nanometer (nm) amorphous silicon (a:Si) semiconductor film, and FIG. 4 shows the characteristics of a 200 nm a:Si film.

The a:Si is sputtered onto Pt on silicon substrate followed by the deposition of the Al electrode. The samples are annealed in forming gas at 400° C. for 5 minutes, to simulate the finalmetal sintering process. Shown in these figures are the large signal resistance (R), and the small signal resistance (r), of the devices as a function of bias voltage. The area of the top Al dot is about $3.14 \times 10^{-6}$ cm$^2$. The resistance of the "forward" biased MSM device is about 100 ohms, while the resistance of the "reversed" biased MSM device is about 10 times higher. Apparently, the Al-a:Si interface forms a Schottky barrier, while the Pt-a:Si interface is a very leaky contact. The "reverse resistance" is about constant for thick a:Si devices, while for 100 nm a:Si devices, the reverse resistance decreases with bias voltage. The "forward resistance" is practically independent of a:Si film thickness. Apparently, the resistance is limited by the contact property, and the reverse resistance decreases with field intensity. This device can be readily incorporated into a cross point array resistance RAM (RRAM) memory cells for reduced read disturbance.

Figure 5:
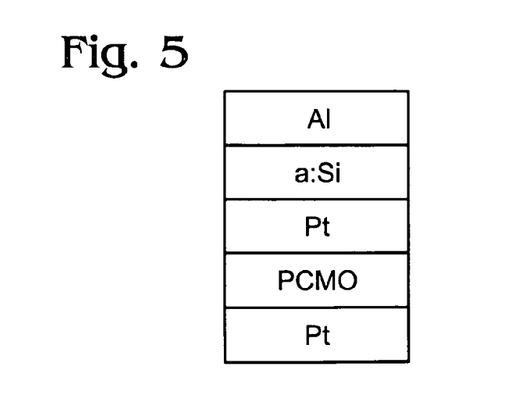
FIG. 5 is a partial cross-sectional view of an exemplary version of the MSM binary switch resistance memory cell of FIG. 1.

FIG. 5 is a partial cross-sectional view of an exemplary version of the MSM binary switch resistance memory cell of FIG. 1. In this RRAM memory cell, the size of the MSM is shown to be about the same as the resistor memory layer. However, the size of the MSM structure can be adjusted to suit the resistance requirement. Unlike a MIM structure, the current flow through a metal/semiconductor/metal sandwich is not a breakdown phenomenon. As a result, the lifetime of the MSM binary switch is much longer than that of metal/insulator/metal structure.

The MSM binary switch resistance memory cell can be programmed (loaded with memory values) using unipolar pulses. A positive high voltage, narrow pulse, such as 4 to 7V pulse with a pulse duration of 10 nanoseconds (ns) to 500 ns, can be used to program the memory cell to a high resistance state. A positive low voltage, wide pulse, such as 2 to 4V pulse, with a pulse duration of 500 ns to 10 microseconds (µs), can be used to reset the memory cell to a low resistor state. The actual pulses used are dependent upon the particular memory resistor properties.

The cross point array can be programmed using the conventional methods understood in the art. For example, one process procedure is to bias all word lines and bit lines at a voltage that is about ⅓ of the programming voltage. Then, the programming voltage pulse is applied to the selected word line, while the selected bit line is set to ground. A voltage pulse amplitude of 3 V to 8 V, with a pulse width of 1 to 300 ns, can be used to write the selected bit to a high resistance state. A pulse amplitude of 2 V to 5 V, with a pulse width of 500 ns to 5 ms, can be used to reset the selected bit resistor to the low resistance state.

The array can also be read using any conventional process. The following discussion demonstrates the advantage of the MSM binary switch structure in a simple read operation, using a load resistor $R_0$. The selected word line voltage is $V_S$ and the un-selected word lines voltage is $V_W$. The unselected word lines voltage $V_W$ is no larger than the low limit of the low output voltage, $V_{OL}$.

When the word lines are properly biased, so that $V_S$ is supplied to the selected word line, and $V_W$ is supplied to the unselected word lines, then current flows from $V_S$, through the selected word line to the output detector, which is assumed to have an input resistance of $R_0$. Simultaneously, current flows from the bit line to the unselected word lines, since the bit line voltage is either equal to, or greater than the unselected word lines voltage.

Figure 6:
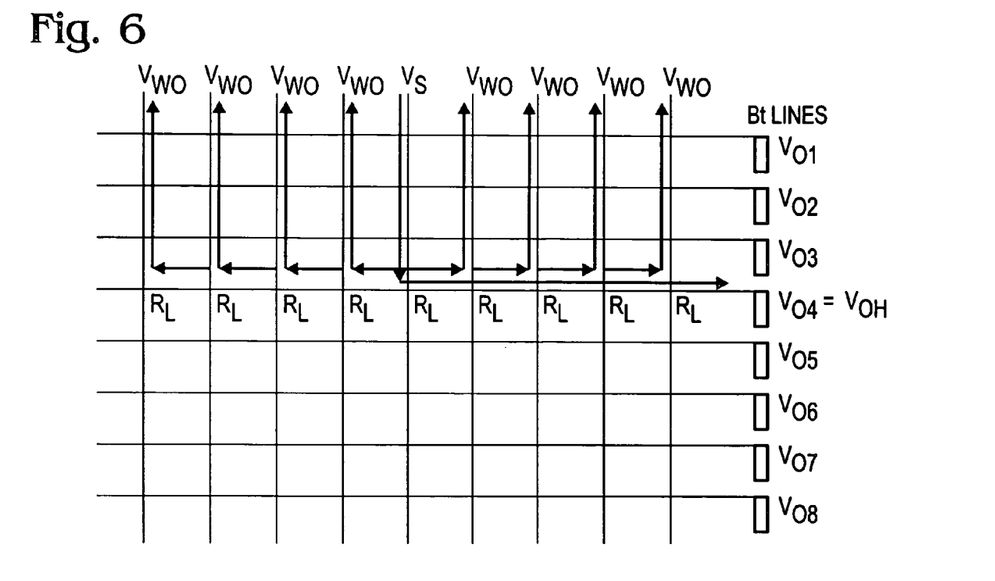
FIG. 6 is a schematic diagram depicting an array when the selected memory cell is in the low resistance state.

FIG. 6 is a schematic diagram depicting an array when the selected memory cell is in the low resistance state. The worst case is when all the unselected memory resistors are in the low resistance state. The output voltage is at a high output voltage ($V_{OH}$).

Figure 7:
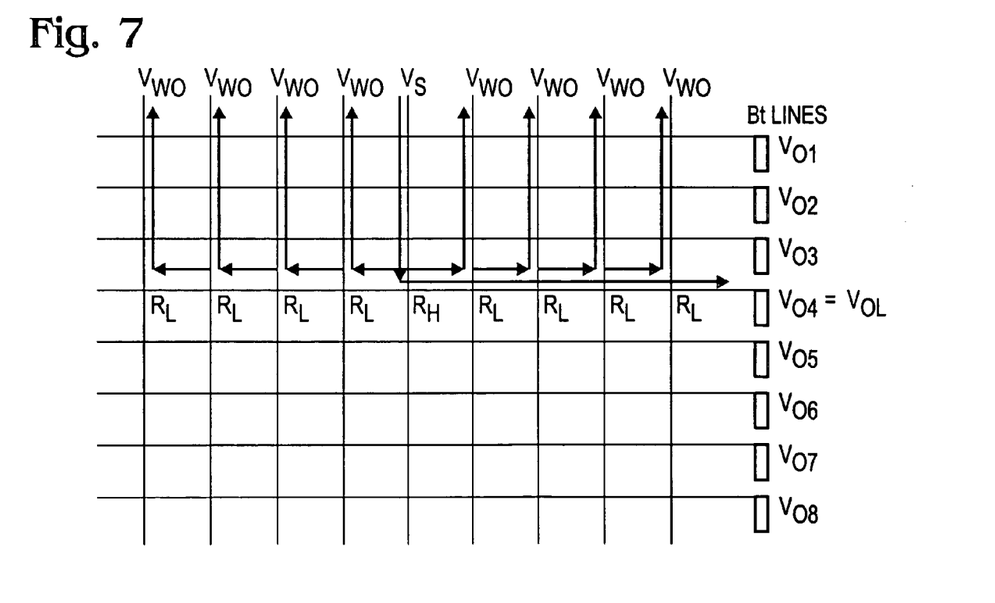
FIG. 7 is a schematic diagram of an array when the selected memory cell is in the high resistance state.

FIG. 7 is a schematic diagram of an array when the selected memory cell is in the high resistance state. In the worst case, the unselected memory cells are at a low resistance and the output voltage is relatively low ($V_{OL}$).

Figure 8:
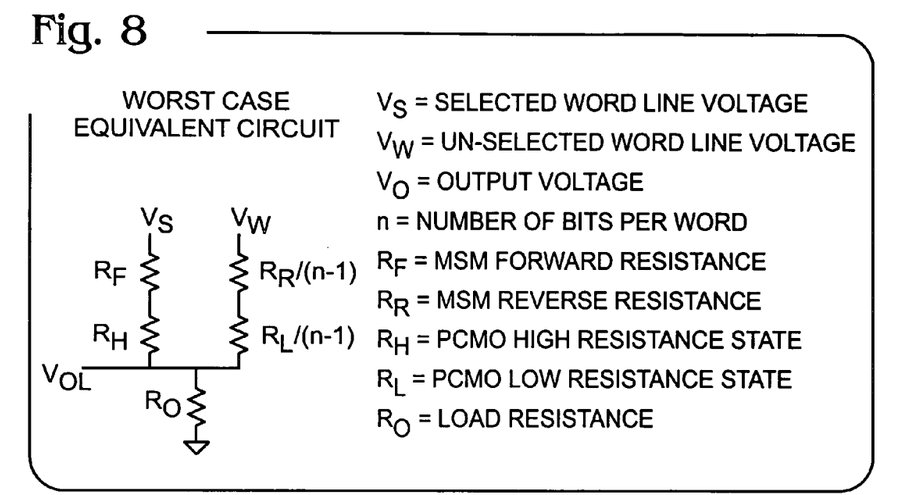
FIG. 8 is a diagram of the worst-case equivalent circuit, when the output voltage of the selected bit is at the low output voltage ($V_{OL}$).

FIG. 8 is a diagram of the worst-case equivalent circuit, when the output voltage of the selected bit is at the low output voltage ($V_{OL}$). Since the bit line voltage is larger than the unselected word line voltage, the unselected memory cell MSM binary switches are reverse biased. The following notations are also shown and defined in this figure.

It can be shown that the output voltage is given by:

$$V_{OL} = \frac{[(R_R+R_L)V_S+(R_F+R_H)(n-1)V_W]R_0}{[(R_F+R_H)(n-1)+(R_R+R_L)]R_0+(R_F+R_H)(R_R+R_L)} \quad (1)$$

When the selected bit is at the low resistance state, the output voltage is at the high voltage state. The output voltage is similar to that of Eq. (1) except $R_H$ is replaced with $R_L$ as follows:

$$V_{OL} = \frac{[(R_R+R_L)V_S+(R_F+R_L)(n-1)V_W]R_0}{[(R_F+R_L)(n-1)+(R_R+R_L)]R_0+(R_F+R_L)(R_R+R_L)} \quad (2)$$

FIGS. 9 through 13 depict the output voltages of equations (1) and (2), plotted as a function of the number of bits in the array. These plots demonstrate the effect MSM binary switches have upon cross point resistor array size.

Figure 9:
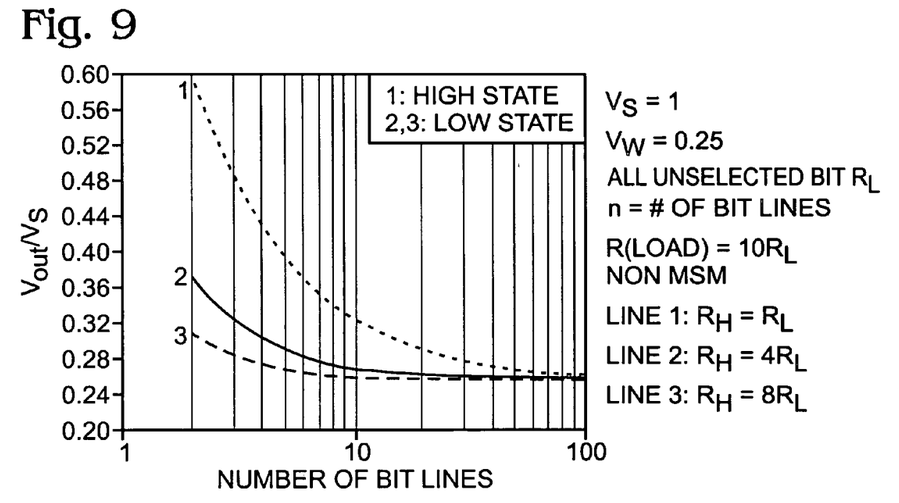
FIGS. 9 through 13 depict the output voltages of equations (1) and (2), plotted as a function of the number of bits in the array.
Figure 10:
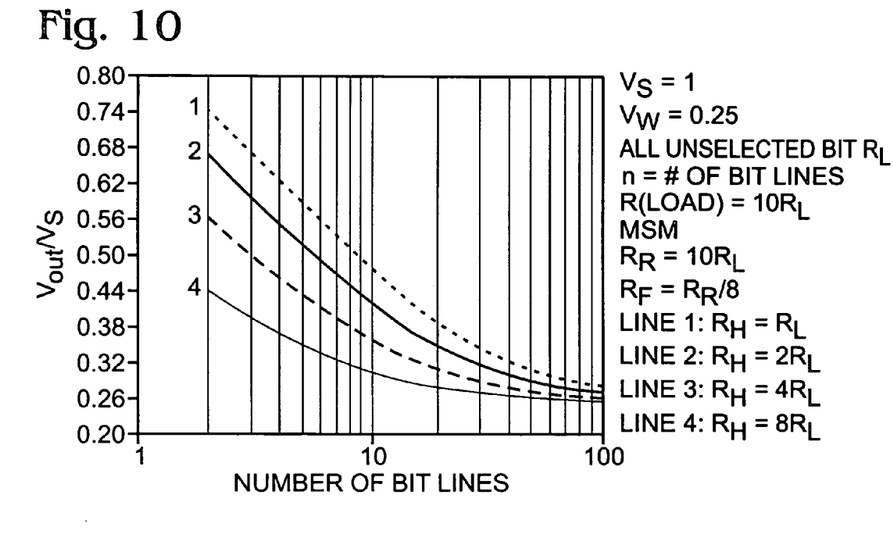

FIG. 9 plots the normalized bit output voltage as a function of the number of bits per word for a conventional memory array that is not using MSM binary switches. Line 1 is the worst case high bit resistance state, and lines 2 and 3 are the low resistance state bit output as a function of the number of bits per word for $R_H=4R_L$ and $R_H=8R_L$, respectively. The output memory voltage window decreases drastically with an increasing number of bits per word. A similar property is demonstrated in FIG. 10 for a memory using the MSM binary switch. The MSM resistance ratio is 8, compared to FIG. 9 for a given output voltage window of 0.06V. That is, for a memory cell without MSM binary switch at n=4 and $R_H=4R_L$, the number of bits per word is increased to 16. However, at n=2 the bit line output voltage shown in FIG. 9 is 0.12. For the same voltage output window, the number of bit lines in FIG. 10 is 8. That is, for the conditions of the above example, the bits line can be increased by a factor of 4. The advantages of an MSM binary switch are obvious.

Figure 11:
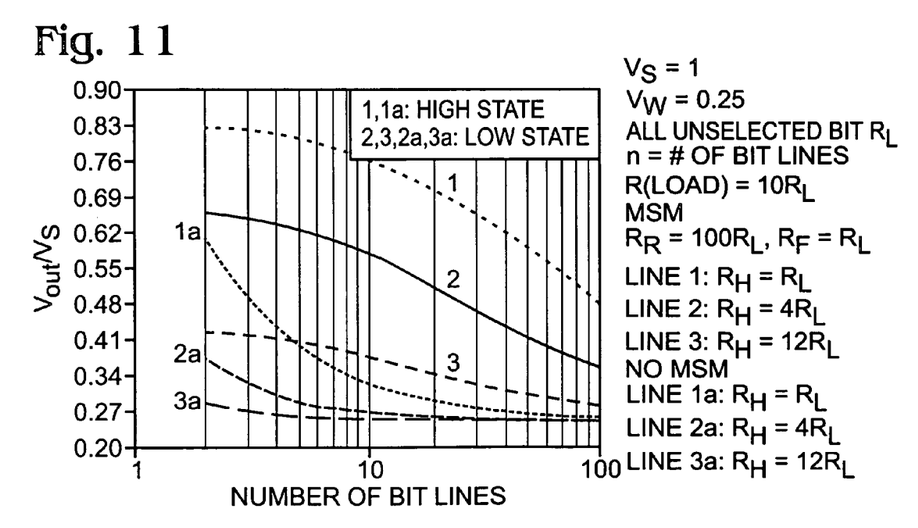

FIG. 11 is a plot of the bit output voltage as a function of the number of bits per word, with a memory resistor switching ratio as a parameter for memory cell with a reverse to forward resistance ratio of 100 MSM devices. It is shown that for a large MSM resistance ratio, for two bits per word, the bit voltage window is about 0.17 V. When there are 100 bits per word, the bit voltage window is about 0.14 V. The bit output voltage window is about independent of the number of bit lines. Therefore, a very large number of bits per word can be fabricated.

Figure 12:
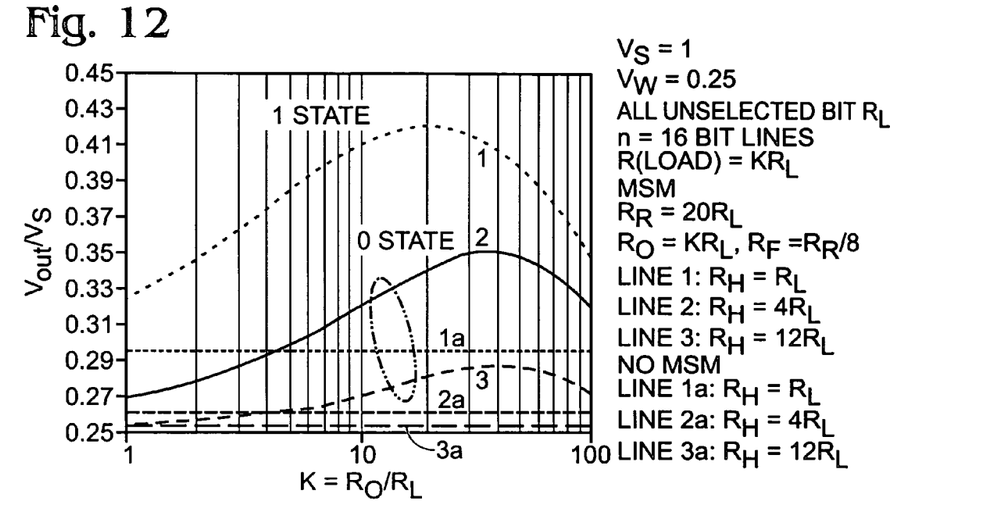

In FIG. 12 the output voltage is shown as a function of a load resistor, with the switching resistance ratio as a parameter. There is an optimum load resistance range of about 7 $R_L$ to 20 $R_L$. This range is not universal and is dependent of the memory resistor switching ratio and load resistance.

Figure 13:
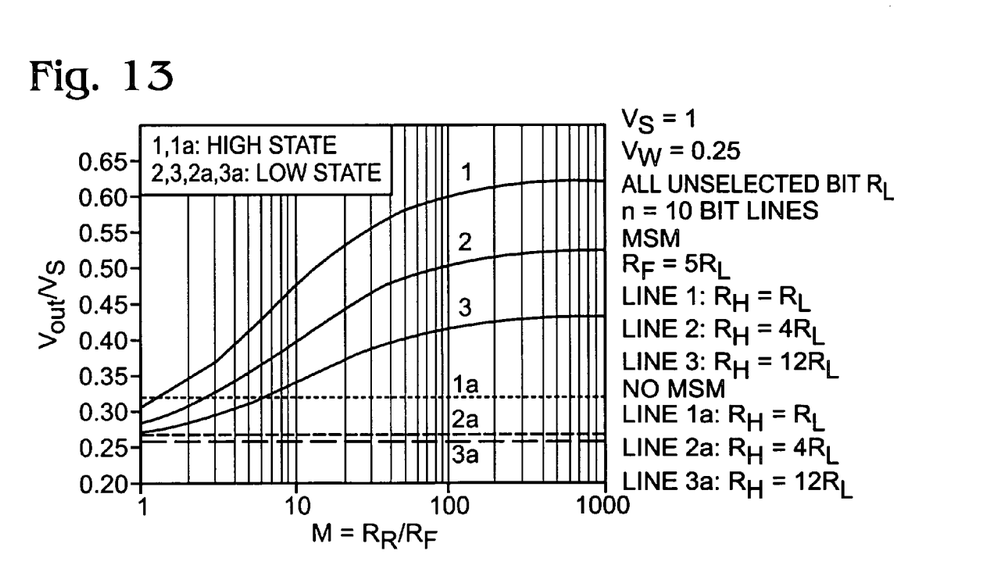

FIG. 13 is a plot showing that the use of MSM binary switches can increase the bit output voltage window as a function of the high/low MSM resistance ratio, for $R_F=5R_L$, n=10. There is no benefit if the high resistance to low resistance ratio of the MSM binary switch is less than 5. At larger MSM resistance ratios, the bit output voltage window tends to saturate. Substantial benefit is obtained when the MSM resistance ratio is larger than 8.

The MSM/PCMO memory cells of FIG. 5 can be integrated into the resistor memory cross point memory array with minimal increase of process complexity. The PCMO is used here for the sake of illustration. Other electrically switchable resistance materials, such as high temperature superconductors, CMR, or perovskite materials may also be used. An exemplary fabrication process is listed below.

1. Follow any state of the art CMOS process to fabricate the supporting CMOS circuit.

2. Deposit oxide having a thickness about 1.5 times that of the gate electrode. CMO oxide stops at the gate electrode.

3. Deposit 100 nm to 500 nm of oxide. This step, and step 2, may be combined together by depositing oxide at least 400 nm thicker than the gate material. CMP to planarize the oxide.

4. Contact photo to open contact holes.

5. Deposit and planarize contact plugs.

6. Deposit and etch RRAM bottom electrode. The bottom electrode material can be any desired RRAM bottom electrode material.

7. Optionally deposit a layer of bottom electrode material at least 1.5 times the thickness of the bottom electrode. CMP oxide stops at the bottom electrode.

8. Deposit RRAM memory resistor material, such as PCMO.

9. Deposit a top electrode. For example, Pt. Note, in this example, Pt is used as the MR top electrode and the MSM bottom electrode.

10. Sputter deposition 100 nm to 300 nm of amorphous silicon.

11. Deposit Al.

12. Photoresist. Stack etch Al/a:Si/Pt/PCMO. Optionally, the Al and a:Si may be etched separately, if the size of the MSM stack is to be different than that of the RRAM resistor. A hard mask may be required for this etching process.

13. Deposit a protection insulator, such as Si3N4 or Al2O3.

14. Deposit passivation oxide.

15. Contact etch and metallization.

16. Forming gas anneal at 350° C. to 450° C., for 5 minutes to 30 minutes.

Most of the above-mentioned steps are conventional processes. Steps 10, 11, and part of Step 12, are novel processes to support the fabrication of the MSM binary switch.

Figure 14:
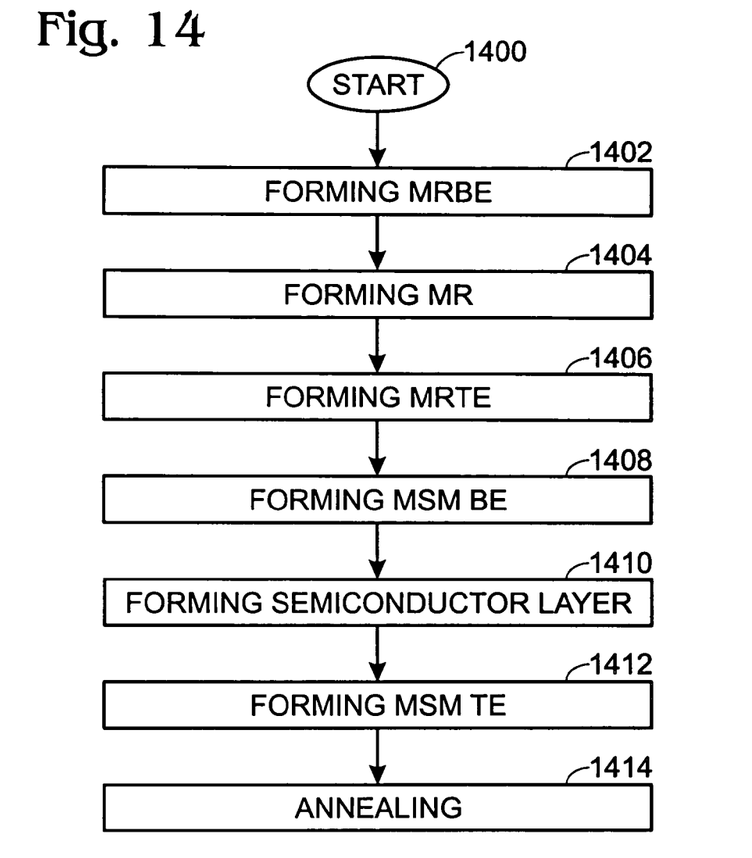
FIG. 14 is a flowchart illustrating a method for forming a MSM binary switch memory device.

FIG. 14 is a flowchart illustrating a method for forming a MSM binary switch memory device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1400.

Step 1402 forms a memory resistor bottom electrode. Step 1404 forms a memory resistor material overlying the memory resistor bottom electrode. Step 1406 forms a memory resistor top electrode overlying the memory resistor material. Step 1408 forms an MSM bottom electrode overlying the memory resistor top electrode. Step 1410 forms a semiconductor layer overlying the MSM bottom electrode. In one aspect, Step 1410 forms the semiconductor layer having a thickness in the range of 20 to 1000 nanometers. Step 1412 forms an MSM top electrode overlying the semiconductor layer. Step 1414 anneals the device in a forming gas, at a temperature in the range of 400° to 450° C., for a duration in the range of 3 to 20 minutes.

The memory resistor material formed in Step 1404 can be $Pr_{0.3}Ca_{0.7}MnO_3$ (PCMO), colossal magnetoresistive (CMR) film, transition metal oxides, Mott insulators, high-temperature super conductor (HTSC), or perovskite materials. However, the device is not limited to any particular memory resistor material. The MSM bottom electrode of Step 1408 may be Pt, Ir, Au, Ag, TiN, or Ti. The MSM top electrode of Step 1412 may be Pt, Ir, Au, TiN, Ti, or Al. The semiconductor layer of Step 1410 may be amorphous Si, $ZnO_2$, or $InO_2$. Again the device is not necessarily limited to just these exemplary materials.

Figure 15:
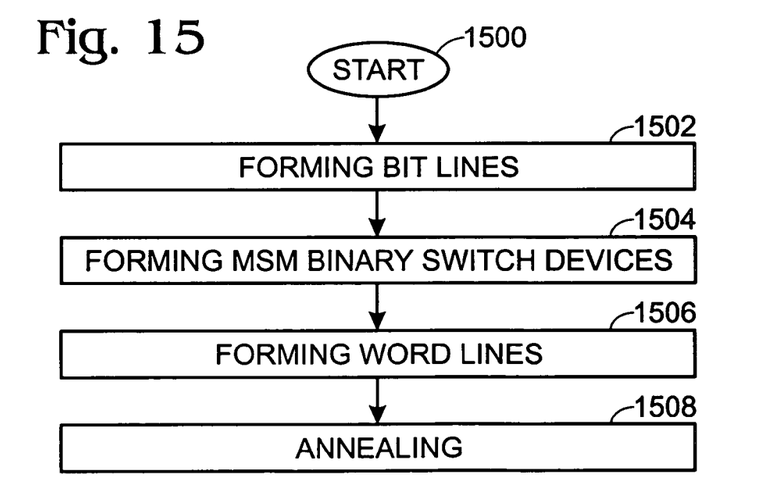
FIG. 15 is a flowchart illustrating a method for forming a MSM binary switch crosspoint memory array.

FIG. 15 is a flowchart illustrating a method for forming a MSM binary switch crosspoint memory array. The method starts at Step 1500. Step 1502 forms a first plurality of bit lines parallely aligned in a first direction. Step 1504 forms a second plurality of MSM binary switch memory devices overlying each bit line. Step 1506 forms a third plurality of word lines parallely aligned in a second direction orthogonal to the first direction. Each word line is connected to each bit line through a unique intervening MSM binary switch memory device. Step 1508 anneals the array in a forming gas, at a temperature of 400° to 450° C., for a duration in the range of 3 to 20 minutes.

Forming the second plurality of MSM binary switch memory devices in Step 1504 includes the following substeps, not shown (see FIG. 14). Step 1504*a* forms a memory resistor material overlying the bit line. Step 1504*b* forms a memory resistor top electrode overlying the memory resistor material. Step 1504*c* forms an MSM bottom electrode overlying the memory resistor top electrode. Step 1504*d* forms a semiconductor layer overlying the MSM bottom electrode. Step 1504*e* forms an MSM top electrode overlying the semiconductor layer at the intersection of the memory device with the word line. Additional substep details of Step 1504 can be found in the explanation of FIG. 14.

Figure 16:
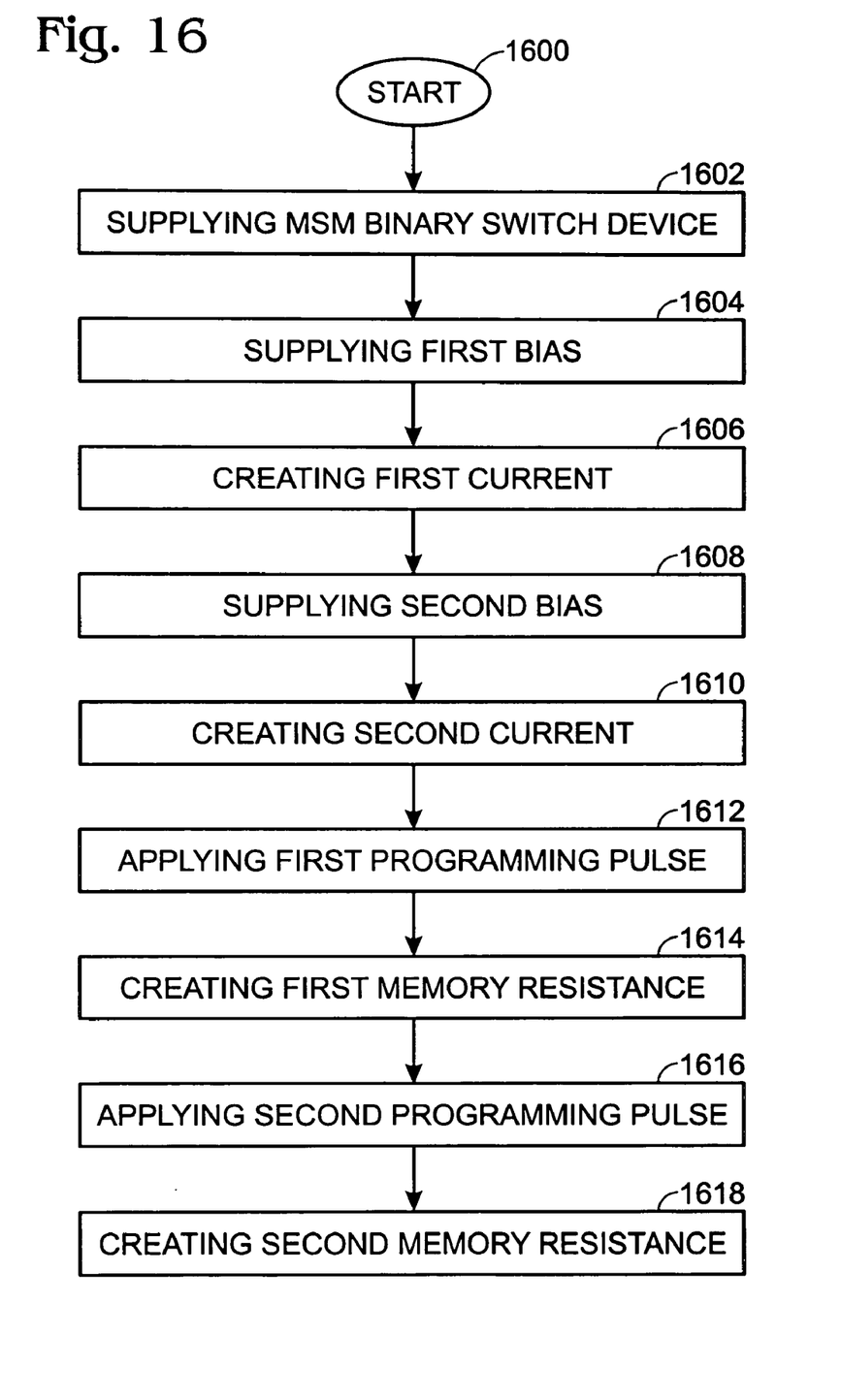
FIG. 16 is a flowchart illustrating an MSM binary switch memory resistance storage method.

FIG. 16 is a flowchart illustrating an MSM binary switch memory resistance storage method. The method starts at Step 1600. Step 1602 supplies a MSM binary switch memory device. Step 1604 supplies a first bias voltage to a first terminal of the device. Step 1606 creates a first current through the device that is responsive to the combination of a memory material resistance and a MSM binary switch forward resistance. Step 1608 supplies a second bias voltage to the first terminal of the device, less than the first bias voltage. Step 1610 creates a second current through the device, less than the first current, that is responsive to the combination of the memory material resistance and a MSM binary switch reverse resistance.

In one aspect, creating the first current through the device in Step 1606 includes creating a first current responsive to a MSM binary switch forward resistance of about 100 ohms. In another aspect, creating the second current through the device in Step 1610 includes creating a second current responsive to a MSM binary switch reverse resistance that is at least eight times greater than the MSM binary switch forward resistance.

Step 1612 applies a first programming pulse to the first terminal of the device, for example, a voltage in the range of 4 to 8 volts, for a pulse duration in the range of 1 ns to 500 ns. Step 1614 creates a first memory material resistance. Step 1616 applies a second programming pulse to the first terminal of the device, for example, voltage in the range of 2 to 4 volts, for a pulse duration in the range of 500 ns to 10 microseconds. Step 1618 creates a second memory material resistance, less than the first memory material resistance.

A metal/semiconductor/metal (MSM) binary switch memory device, array, fabrication processes, and method of use have been presented. Particular materials and process details have been provided as examples to illustrate the invention. However, the invention is not limited to merely these examples. Other variations and embodiments of the invention will occur to those skilled in the art.

We claim:

1. A method for forming a metal/semiconductor/metal (MSM) binary switch memory device, the method comprising:
    forming a memory resistor bottom electrode;
    forming a memory resistor material overlying the memory resistor bottom electrode;
    forming a memory resistor top electrode overlying the memory resistor material;
    forming a MSM bottom electrode overlying the memory resistor top electrode;
    forming a semiconductor layer overlying the MSM bottom electrode;
    forming an MSM top electrode overlying the semiconductor layer; and,
    wherein forming the semiconductor layer includes forming the semiconductor layer having a thickness in the range of 20 to 1000 nanometers.

2. The method of claim 1 further comprising:
    annealing in a forming gas, at a temperature in the range of 400° to 450° C., for a duration in the range of 3 to 20 minutes.

3. The method of claim 1 wherein forming the memory resistor material overlying the memory resistor bottom electrode includes forming the memory resistor from a material selected from the group comprising $Pr_{0.3}Ca_{0.7}MnO_3$ (PCMO), colossal magnetoresistive (CMR) film, transition metal oxides, Mott insulators, high-temperature super conductor (HTSC), and perovskite materials.

4. The method of claim 1 wherein forming the MSM bottom electrode includes forming the MSM bottom electrode from a material selected from the group comprising Pt, Ir, Au, Ag, TiN, and Ti.

5. The method of claim 1 wherein forming the MSM top electrode includes forming the MSM top electrode from a material selected from the group comprising Pt, Ir, Au, TiN, Ti, and Al.

6. The method of claim 1 wherein forming the semiconductor layer overlying the MSM bottom electrode includes forming the semiconductor layer from a material selected from the group comprising amorphous Si, ZnO2, and InO2.

7. A method for forming a metal/semiconductor/metal (MSM) binary switch crosspoint memory array, the method comprising:
    forming a first plurality of bit lines parallely aligned in a first direction;
    forming a second plurality of MSM binary switch memory devices overlying each bit line;

forming a third plurality of word lines parallely aligned in a second direction, orthogonal to the first direction;

annealing the array in a forming gas, at a temperature of 400° to 450° C., for a duration in the range of 3 to 20 minutes; and, wherein each word line is connected to each bit line through a unique intervening MSM binary switch memory device.

8. The method of claim 7 wherein forming the second plurality of MSM binary switch memory devices includes:

forming a memory resistor material overlying the bit line;

forming a memory resistor top electrode overlying the memory resistor material;

forming a MSM bottom electrode overlying the memory resistor top electrode;

forming a semiconductor layer overlying the MSM bottom electrode; and, forming an MSM top electrode overlying the semiconductor layer at an intersection of the memory device with the word line.

9. The method of claim 8 wherein forming the memory resistor material overlying the bit line includes forming the memory resistor from a material selected from the group comprising $Pr_{0.3}Ca_{0.7}MnO_3$ (PCMO), colossal magnetoresistive (CMR) film, transition metal oxides, Mott insulators, high-temperature super conductor (HTSC), and perovskite materials.

10. The method of claim 8 wherein forming the semiconductor layer includes forming the semiconductor layer having a thickness in the range of 20 to 1000 nanometers.

11. The method of claim 7 wherein forming the MSM bottom electrode includes forming the MSM bottom electrode from a material selected from the group comprising Pt, Ir, Au, Ag, TiN, and Ti.

12. The method of claim 7 wherein forming the MSM top electrode includes forming the MSM top electrode from a material selected from the group including Pt, Ir, Au, TiN, Ti, and Al.

13. The method of claim 7 wherein forming the semiconductor layer overlying the MSM bottom electrode includes forming the semiconductor layer from a material selected from the group comprising amorphous Si, ZnO2, and InO2.

14. A metal/semiconductor/metal (MSM) binary switch memory resistance storage method, the method comprising:

supplying a MSM binary switch memory device;

supplying a first bias voltage to a first terminal of the device;

creating a first current through the MSM binary switch memory device that is responsive to the combination of a memory material resistance and a MSM binary switch forward resistance;

supplying a second bias voltage to the first terminal of the device, less than the first bias voltage; and, creating a second current through the device, less than the first current, that is responsive to a combination of the memory material resistance and a MSM binary switch reverse resistance.

15. The method of claim 14 further comprising:

applying a first programming pulse to the first terminal of the device;

creating a first memory material resistance;

applying a second programming pulse to the first terminal of the MSM binary switch memory device; and, creating a second memory material resistance, less than the first memory material resistance.

16. The method of claim 15 wherein applying the first programming pulse includes applying a voltage in the range of 4 to 8 volts for a pulse duration in the range of 1 nanosecond (ns) to 500 ns; and, wherein applying the second programming pulse includes applying a voltage in the range of 2 to 4 volts for a pulse duration in the range of 500 ns to 10 microseconds (us).

17. The method of claim 14 creating the first current through the device that is responsive to the combination of the memory material resistance and the MSM binary switch forward resistance includes creating a first current responsive to a MSM binary switch forward resistance of about 100 ohms.

18. The method of claim 14 wherein creating the second current through the device that is responsive to the combination of the memory material resistance and the MSM binary switch reverse resistance includes creating a second current responsive to a MSM binary switch reverse resistance that is at least eight times greater than the MSM binary switch forward resistance.

19. A method for forming a metal/semiconductor/metal (MSM) binary switch memory device, the method comprising:

forming a memory resistor bottom electrode;

forming a memory resistor material overlying the memory resistor bottom electrode;

forming a memory resistor top electrode overlying the memory resistor material;

forming an MSM bottom electrode overlying the memory resistor top electrode;

forming a semiconductor layer overlying the MSM bottom electrode; forming an MSM top electrode overlying the semiconductor layer; and, annealing in a forming gas, at a temperature in the range of 400° to 450° C., for a duration in the range of 3 to 20 minutes.

20. A method for forming a metal/semiconductor/metal (MSM) binary switch memory device, the method comprising:

forming a memory resistor bottom electrode;

forming a memory resistor material overlying the memory resistor bottom electrode;

forming a memory resistor top electrode overlying the memory resistor material;

forming an MSM bottom electrode overlying the memory resistor top electrode;

forming a semiconductor layer overlying the MSM bottom electrode;

forming an MSM top electrode overlying the semiconductor layer; and, wherein forming the memory resistor material overlying the memory resistor bottom electrode includes forming the memory resistor from a material selected from the group comprising $Pr_{0.3}Ca_{0.7}MnO_3$ (PCMO), colossal magnetoresistive (CMR) film, transition metal oxides, Mott insulators, high-temperature super conductor (HTSC), and perovskite materials.

21. A method for forming a metal/semiconductor/metal (MSM) binary switch crosspoint memory array, the method comprising:

forming a first plurality of bit lines parallely aligned in a first direction;

forming a second plurality of MSM binary switch memory devices overlying each bit line;

forming a third plurality of word lines parallely aligned in a second direction, orthogonal to the first direction;

wherein each word line is connected to each bit line through a unique intervening MSM binary switch memory device wherein forming the second plurality of MSM binary switch memory devices includes:
  forming a memory resistor material overlying the bit line;
  forming a memory resistor top electrode overlying the memory resistor material;
  forming an MSM bottom electrode overlying the memory resistor top electrode;
  forming a semiconductor layer overlying the MSM bottom electrode; and,
  forming an MSM top electrode overlying the semiconductor layer at the intersection of the memory device with the word line; and,
wherein forming the memory resistor material overlying the bit line includes forming the memory resistor from a material selected from the group comprising $Pr_{0.3}Ca_{0.7}MnO_3$ (PCMO), colossal magnetoresistive (CMR) film, transition metal oxides, Mott insulators, high-temperature super conductor (HTSC), and perovskite materials.

22. A method for forming a metal/semiconductor/metal (MSM) binary switch crosspoint memory array, the method comprising:
  forming a first plurality of bit lines parallely aligned in a first direction;
  forming a second plurality of MSM binary switch memory devices overlying each bit line;
  forming a third plurality of word lines parallely aligned in a second direction, orthogonal to the first direction;
  wherein each word line is connected to each bit line through a unique intervening MSM binary switch memory device;
  wherein forming the second plurality of MSN binary switch memory devices includes:
    forming a memory resistor material overlying the bit line;
    forming a memory resistor top electrode overlying the memory resistor material;
    forming an MSM bottom electrode overlying the memory resistor top electrode;
    forming a semiconductor layer overlying the MSM bottom electrode; and,
    forming an MSM top electrode overlying the semiconductor layer at the intersection of the memory device with the word line; and,
  wherein forming the semiconductor layer includes forming the semiconductor layer having a thickness in the range of 20 to 1000 nanometers.

* * * * *